United States Patent
Helbing

(10) Patent No.: US 8,159,131 B2
(45) Date of Patent: Apr. 17, 2012

(54) LIGHT EMITTING DEVICE HAVING A TRANSPARENT THERMALLY CONDUCTIVE LAYER

(75) Inventor: Rene Helbing, Sunnyvale, CA (US)

(73) Assignee: Bridgelux, Inc., Sunnyvale, CA (US)

( * ) Notice: Subject to any disclaimer, the term of this patent is extended or adjusted under 35 U.S.C. 154(b) by 327 days.

(21) Appl. No.: 12/164,484

(22) Filed: Jun. 30, 2008

(65) Prior Publication Data

US 2009/0322197 A1 Dec. 31, 2009

(51) Int. Cl.
*H01L 51/50* (2006.01)
(52) U.S. Cl. ......................................................... 313/512
(58) Field of Classification Search ...................... 445/24; 313/504, 512
See application file for complete search history.

(56) References Cited

U.S. PATENT DOCUMENTS

| 6,357,889 | B1 * | 3/2002 | Duggal et al. | 362/84 |
|---|---|---|---|---|
| 6,600,175 | B1 * | 7/2003 | Baretz et al. | 257/100 |
| 6,674,097 | B2 * | 1/2004 | Komoto et al. | 257/98 |
| 7,482,636 | B2 | 1/2009 | Murayama et al. | |
| 2004/0257797 | A1 * | 12/2004 | Suehiro et al. | 362/34 |
| 2006/0261364 | A1 * | 11/2006 | Suehiro et al. | 257/100 |
| 2007/0041185 | A1 * | 2/2007 | Yatsuda et al. | 362/231 |
| 2007/0131954 | A1 * | 6/2007 | Murayama et al. | 257/98 |
| 2007/0145397 | A1 | 6/2007 | DenBaars et al. | |
| 2007/0295969 | A1 | 12/2007 | Chew et al. | |

FOREIGN PATENT DOCUMENTS

KR 20070007019 A 1/2007

OTHER PUBLICATIONS

Notice of Preliminary Rejection mailed Jan. 19, 2012 in Korean Patent Application No. 2010-7029760 filed Jan. 12, 2007 (with English translation.

\* cited by examiner

*Primary Examiner* — Toan Ton
*Assistant Examiner* — Hana Featherly

(57) ABSTRACT

A light emitting device and method of producing the same is disclosed. The light emitting device includes a transparent thermally conductive layer, a phosphor layer provided on the transparent thermally conductive layer, and at least one light emitting semiconductor arranged to emit light toward the transparent thermally conductive layer and the phosphor layer.

17 Claims, 7 Drawing Sheets

LIGHT EMITTING DEVICE HAVING A TRANSPARENT THERMALLY CONDUCTIVE LAYER

BACKGROUND

1. Field

The present disclosure relates to light emitting devices, and more particularly, to semiconductor light emitting devices having a phosphor layer.

2. Background

Light emitting diodes (LEDs) are attractive candidates for replacing conventional light sources, such as incandescent lamps and fluorescent light sources. LEDs have substantially higher light conversion efficiencies than incandescent lamps and longer lifetimes than both types of conventional light sources. In addition, some types of LEDs now have higher conversion efficiencies than fluorescent light sources and still higher conversion efficiencies have been demonstrated in the laboratory. Furthermore, LEDs require lower voltages than fluorescent lamps, and therefore, are better suited for applications in which the light source must be powered from a low-voltage source, such as a battery or an internal computer DC power source.

Unfortunately, LEDs produce light in a relatively narrow spectrum band. To replace conventional lighting sources, LEDs that generate light that appears to be "white" to the human observer are required. A light source that appears to be white and that has a conversion efficiency comparable to that of fluorescent light sources can be constructed from a blue light emitting semiconductor covered with a layer of phosphor that converts a portion of the blue light to yellow light. If the ratio of blue to yellow light is chosen correctly, the resultant light source appears white to a human observer. In applications requiring high power illumination, however, the phosphor layer may overheat because in the conversion process it itself generates heat. The heat, if not sufficiently dissipated, may cause degradation of the phosphor layer, decreasing the device's performance and life-span.

To improve the efficiency of light output as well as the color consistency, some contemporary devices are designed with a separately manufactured phosphor layer mounted further away from the light emitting semiconductor. This approach, however, creates additional problems. The phosphor layer may heat up significantly due to the light conversion process itself, resulting in decreased efficiency and degradation. Hence, such a design does not effectively address the heat dissipation issue as it does not provide any means for dissipating the heat away from the phosphor layer.

Accordingly, although contemporary LEDs have proven generally suitable for their intended purposes, they possess inherent deficiencies which detract from their overall effectiveness and desirability. As such, there exists a need for small, high-power "white light" LEDs with a system for dissipating heat from the phosphor layer.

SUMMARY

In one aspect of the disclosure, an apparatus includes a transparent thermally conductive layer, a phosphor layer provided on the transparent thermally conductive layer, and at least one light emitting semiconductor arranged to emit light toward the transparent thermally conductive layer and the phosphor layer.

In another aspect of the disclosure, an apparatus includes a stack having alternating layers of at least one transparent thermally conductive layer and at least one phosphor layer, and at least one light emitting semiconductor arranged to emit light toward the stack.

In a further aspect of the disclosure, a light emitting device, includes at least one phosphor layer provided on a transparent thermally conductive layer having a thermal conductivity greater than that of the at least one phosphor layer.

In yet a further aspect of the disclosure, a method for manufacturing a light emitting device includes depositing at least one phosphor mixture onto a transparent thermally conductive layer.

It is understood that other aspects of light emitting devices will become readily apparent to those skilled in the art from the following detailed description, wherein it is shown and described only in examples of various aspects of light emitting devices by way of illustration. As will be realized, the various aspects of light emitting devices disclosed herein are capable of modification in various other respects, all without departing from the spirit and scope of the present disclosure. Accordingly, the drawings and detailed description that follow are to be regarded as illustrative in nature and not as restrictive.

BRIEF DESCRIPTION OF THE DRAWINGS

Various aspects of the present disclosure are illustrated by way of example, and not by way of limitation, in the accompanying drawings, wherein.

DETAILED DESCRIPTION

The detailed description set forth below in connection with the appended drawings is intended as a description of various aspects of light emitting devices and is not intended to represent all ways in which aspects of the present invention may be practiced. The detailed description may include specific details for the purpose of providing a thorough understanding of various aspects of light emitting devices; however, it will be apparent to those skilled in the art that the present invention may be practiced without these specific details. In some instances, well-known structures and components are summarily described and/or shown in block diagram form in order to avoid obscuring the concepts of the present invention.

Furthermore, various descriptive terms used herein, such as "provided on" and "transparent," should be given the broadest meaning possible within the context of the present disclosure. For example, when a layer is said to be "provided on" another layer, it should be understood that that one layer may be deposited, etched, attached, or otherwise prepared or fabricated directly or indirectly above that other layer. Also, something that is described as being "transparent" should be understood as having a property allowing no significant obstruction or absorption of electromagnetic radiation in the particular wavelength (or wavelengths) of interest.

Figure 1:
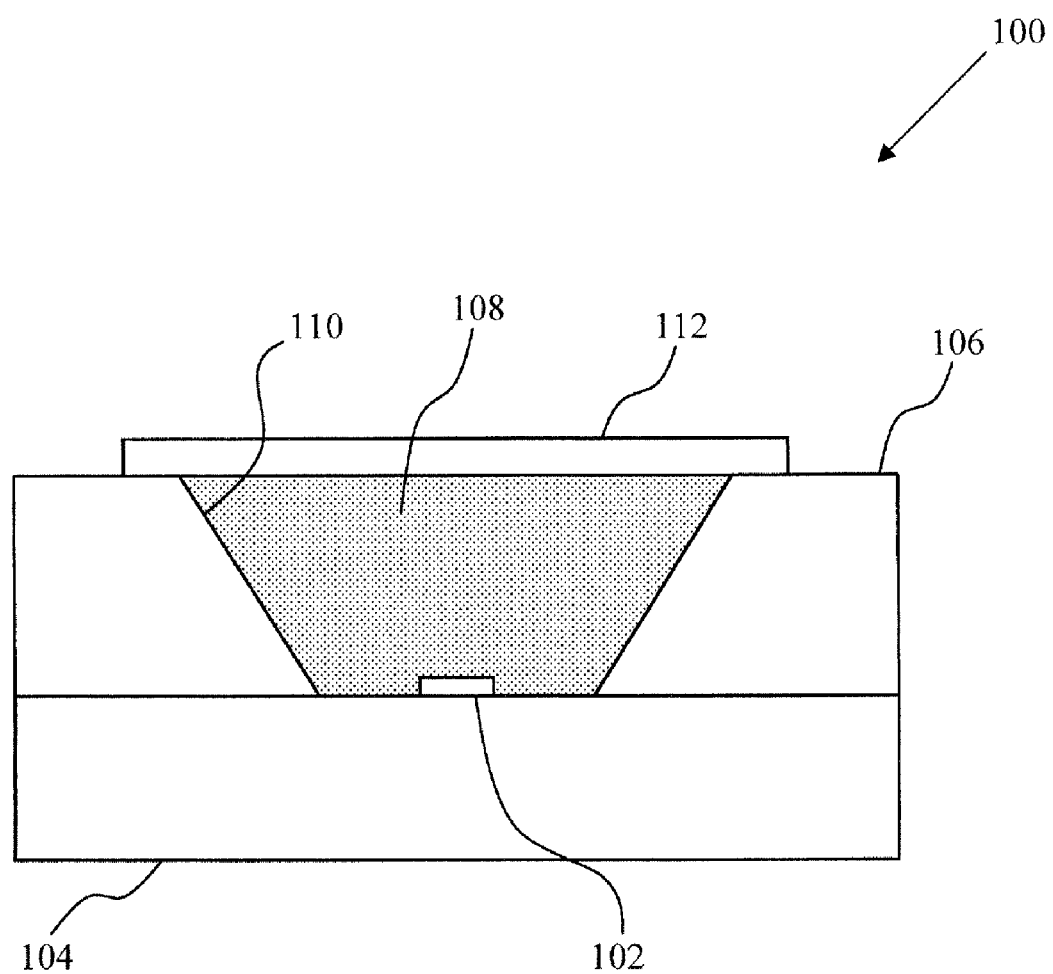
FIG. 1 is a cross-section view illustrating an example of a light emitting device.

FIG. 1 is a cross-section view illustrating an example of a light emitting device 100 having a phosphor layer 112. In this example, the device may include a blue light emitting semiconductor 102 provided on a substrate 104. The light emitting semiconductor 102 may be driven by a power source (not shown) that is electrically coupled to the light emitting semiconductor 102 via electrically conductive traces (not shown). The substrate 104 may be an insulating material, such as ceramic or epoxy laminate, for example. A recessed housing 106, which is provided on the substrate 104, may be formed by boring a cavity 108, such as a conical cavity, for example, in a layer of a material, such as ceramic, resin, polyphthalamide, polycarbonate, or some other suitable material; coating an inner wall 110 of the cavity 108 with a reflective material, such as, for example, aluminum, silver, or a suitable plastic impregnated via injection molding with titanium dioxide, for example; and then bonding the housing 106 onto the substrate 104. Alternatively, the recessed housing 106 may be formed by boring the cavity 108 directly in the substrate 104. The light emitting semiconductor 102 may be bonded to the substrate 104 after the recessed housing 106 is formed.

After the light emitting semiconductor 102 is bonded to the substrate 104, a transparent index-matching material, such as silicone, may be deposited into the cavity 108. Thereafter, the phosphor layer 112 may be provided on the recessed housing 106 covering the cavity 108 and the light emitting semiconductor 102.

The phosphor layer 112 is used in combination with the light emitting semiconductor 102 to create light with a range of color temperatures and spectral composition. The phosphor layer 112 may include a mixture of silicone and phosphor particles, which are evenly dispersed and suspended within the silicone. The phosphor particles may be of different colors (e.g., yellow, red, blue) in order to enhance a color rendering index of the light produced by the device 100. The phosphor layer 112 may have a round disk-like shape in order to provide a uniform radiation pattern.

During operation, the light emitting semiconductor 102 may emit a blue light. A portion of the blue light may be absorbed by the phosphor particles of the phosphor layer 112 and the remaining blue light may pass through the phosphor layer 112. Once the blue light is absorbed by a phosphor particle, the phosphor particle may emit a light of its respective color. This secondary emission of colored light from the phosphor particle is optically mixed with the remaining blue light, and the mixed spectra thus produced is perceived by the human eye as being white.

Unfortunately, converting blue light to other wavelengths in the phosphor is not 100% efficient. Each photon of blue light can only generate one photon of light at a lower wavelength (and lower energy), a process also known as Stokes shift. In addition, each photon of blue light absorbed by the phosphor particle may not always produce a photon of a different wavelength. In both cases, this lost energy is absorbed by the phosphor and is emitted as heat into the phosphor layer 112. For small devices, this generated heat is very small and typically has no significant effect on the performance of the device. But for more powerful devices, such as those exceeding 1 watt in consumed electrical power, the amount of heat generated inside the phosphor layer becomes significant if it is not sufficiently dissipated. Excessive heat may consequently degrade the phosphor layer and reduce its efficiency. That is, the phosphor layer will still absorb the same amount of radiant optical power, but will emit less light. As a result, the luminance may decrease and the color temperature may shift from white to blue, adversely affecting the performance of the device 100. In order to dissipate the heat generated within the phosphor layer 112, a heat dissipating structure may be integrated into the light emitting device, as shown in FIG. 2A.

Figure 2A:
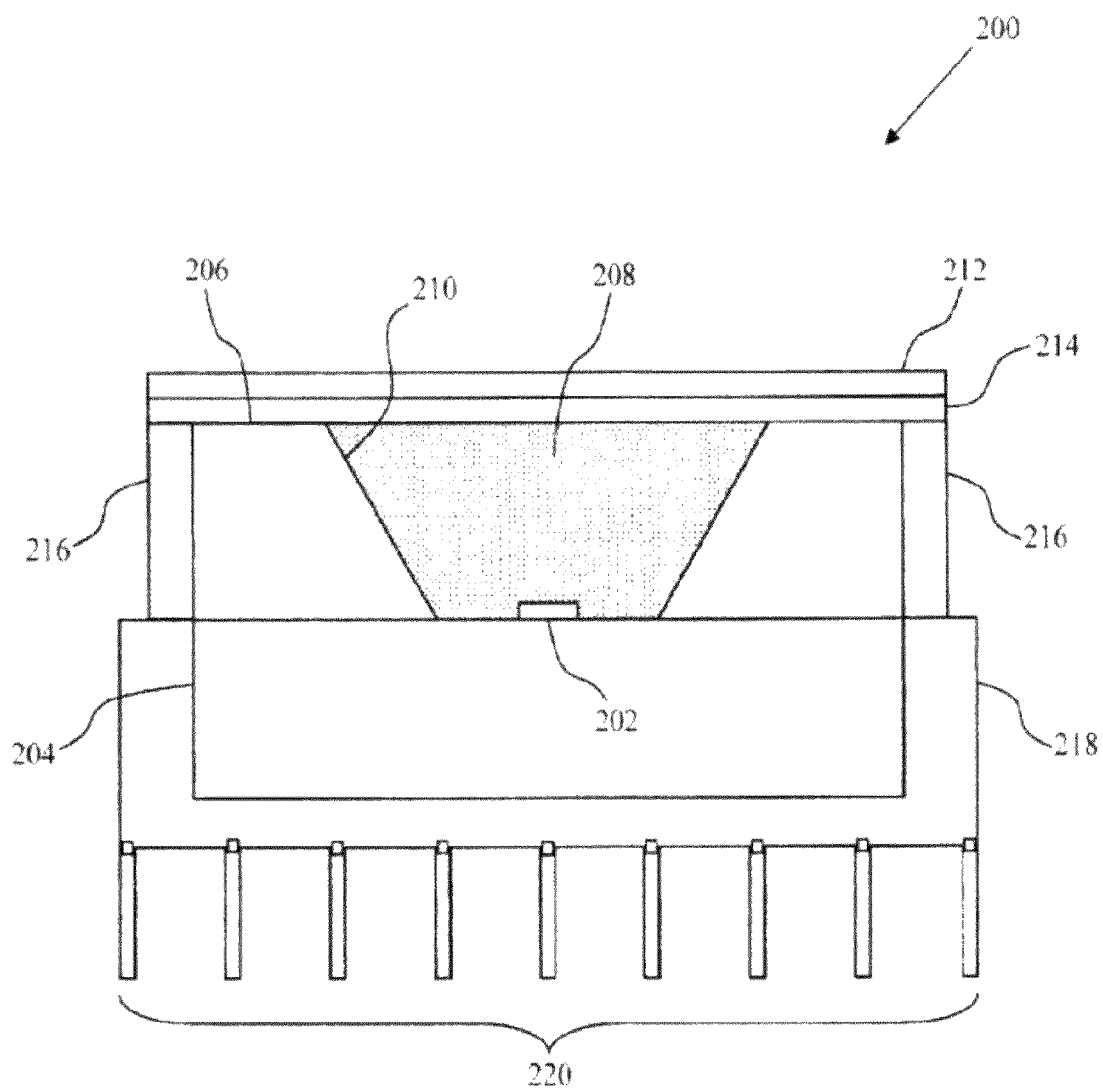
FIG. 2A is a cross-section view illustrating an example of a light emitting device having a transparent thermally conductive layer.

FIG. 2A is a cross-section view illustrating an example of a device 200 having a heat dissipating structure with a transparent thermally conductive layer 214. Light emitting semiconductor 202, substrate 204, recessed housing 206, cavity 208, reflective inner wall 210, and phosphor layer 212 of FIG. 2A correspond to the light emitting semiconductor 102, substrate 104, recessed housing 106, cavity 108, reflective inner wall 110, and phosphor layer 112 of FIG. 1, respectively, and as such, their respective descriptions are omitted. The heat dissipating structure of device 200 may include the transparent layer 214, a metal housing 216, a heat-sink 218, and fins 220. The metal housing 216, the heat-sink 218, and the fins 220 may all be composed of a heat conductive material, such as copper, aluminum, aluminum nitride, or diamond, for example.

The phosphor layer 212 may be provided on the transparent layer 214 via laminating, screen printing, or any other suitable method that thermally couples the phosphor layer 212 to the transparent layer 214. The transparent layer 214 may be a transparent and thermally conductive material, such as, for example, glass, sapphire, diamond, or any other suitable transparent thermally conductive material having a thermal conductivity greater than that of the phosphor layer 212. The phosphor layer 212 may be a phosphor-silicone mixture including phosphor particles of a particular color or a combination of colors (e.g., yellow, red, green) and of a particular type, such as garnet structure phosphors (e.g., yttrium aluminum garnet, terbium aluminum garnet), sulfide phosphors (e.g., zinc sulfide, strontium sulfide), selenide phosphors (e.g., cadmium selenide, zinc selenide), silicate phosphors (e.g. barium silicate, strontium silicate, calcium silicate) and alkali halide phosphors (e.g., cesium chloride, potassium bromide). Any of the foregoing phosphors may be activated by cerium, europium, or other similar rare earth metals familiar to those skilled in the art. The phosphor particles may have a diameter of about 3 μm to 25 μm, but are not limited thereto.

Figure 2B:
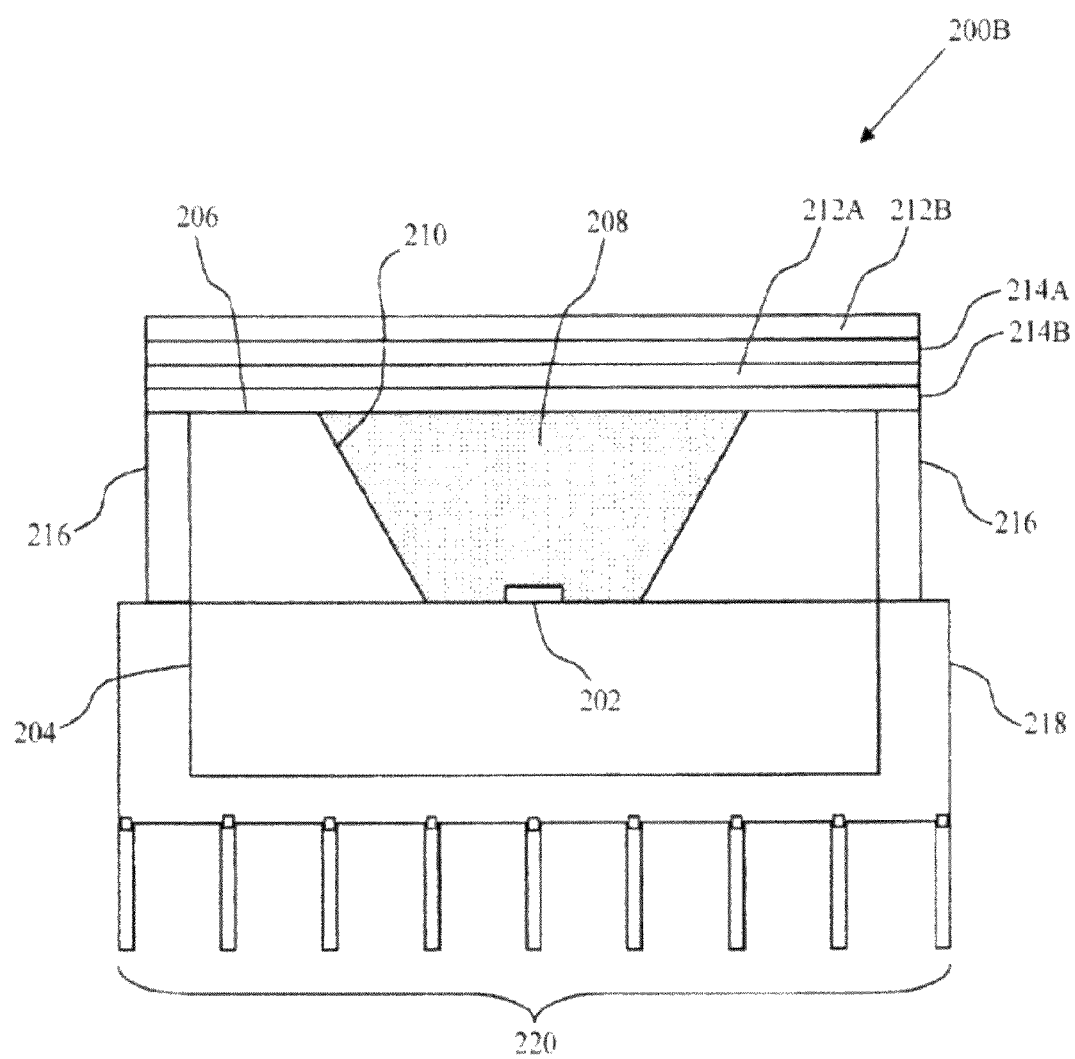
FIG. 2B is a cross-section view illustrating an example of a light emitting device having two phosphor layers stacked with two transparent layers in an alternating manner.

Once thermally coupled, the phosphor layer 212 and the transparent layer 214 may be provided on the recessed housing 206, covering the cavity 208. Although FIG. 2A shows the phosphor layer 212 as being located over the transparent layer 214, the order of the layers may be reversed such that the phosphor layer 212 is located below the transparent layer 214. Furthermore, as illustrated in FIG. 2B, any number of phosphor layers 212 and any number of transparent layers 214 may be coupled to one another to create a stacked layer structure. For example, two phosphor layers 212 having phosphors of a different color, type, and/or thickness may be stacked with two different transparent layers in an alternating manner, such that the two phosphor layers 212 are separated by one transparent layer 214 and the two transparent layers 214 are separated by one phosphor layer 212.

The transparent layer 214 may be thermally coupled to the metal housing 216 by any suitable method, such as welding, soldering, or mechanical crimping, for example. The resulting thermal bond between the transparent layer 214 and the metal housing 216 may also be a hermetic bond that seals and protects the cavity 208 from extreme fluctuations in temperature, pressure, and other environmental conditions.

The metal housing 216 may be bonded to the heat-sink 218 such that the metal housing 216 and the heat-sink 218 are thermally coupled or thermally isolated from one another. The metal housing 216 and the heat-sink 218 may be provided at the outer side walls of the recessed housing 206 and the substrate 204, with the heat-sink 218 being thermally coupled to the bottom of the substrate 204.

It may be desirable to thermally isolate the metal housing 216 and the heat-sink 218 in the case where the temperature of the heat-sink 218 exceeds the temperature of the phosphor layer 212 due to the high heat generated by the light emitting semiconductor 202. Such thermal isolation prevents heat from being transferred from the heat-sink 218 to the phosphor layer 212 via the metal housing 216. The metal housing 216 may thus have its own heat venting fins (not shown) and act as a heat sink for the phosphor layer 212. In the case where the temperature of the phosphor layer 212 is greater than that of the heat-sink 218, it may be desirable to thermally couple the metal housing 216 and the heat-sink 218 to allow for heat transfer from the phosphor layer 212 to the heat-sink 218 via the metal housing 216.

During operation of the device 200, in the case where the metal housing 216 and the heat-sink 218 are thermally coupled, the heat generated by the phosphor particles in the phosphor layer 212 may be dissipated from the phosphor layer 212 to the metal housing 216 via the transparent layer 214, as well as the phosphor layer 212 itself. The metal housing 216 transfers the heat to the heat-sink 218, which in turn vents the heat to the outside environment via the fins 220. As such, the phosphor layer 212 is cooled, preventing or reducing its degradation.

Figure 3:
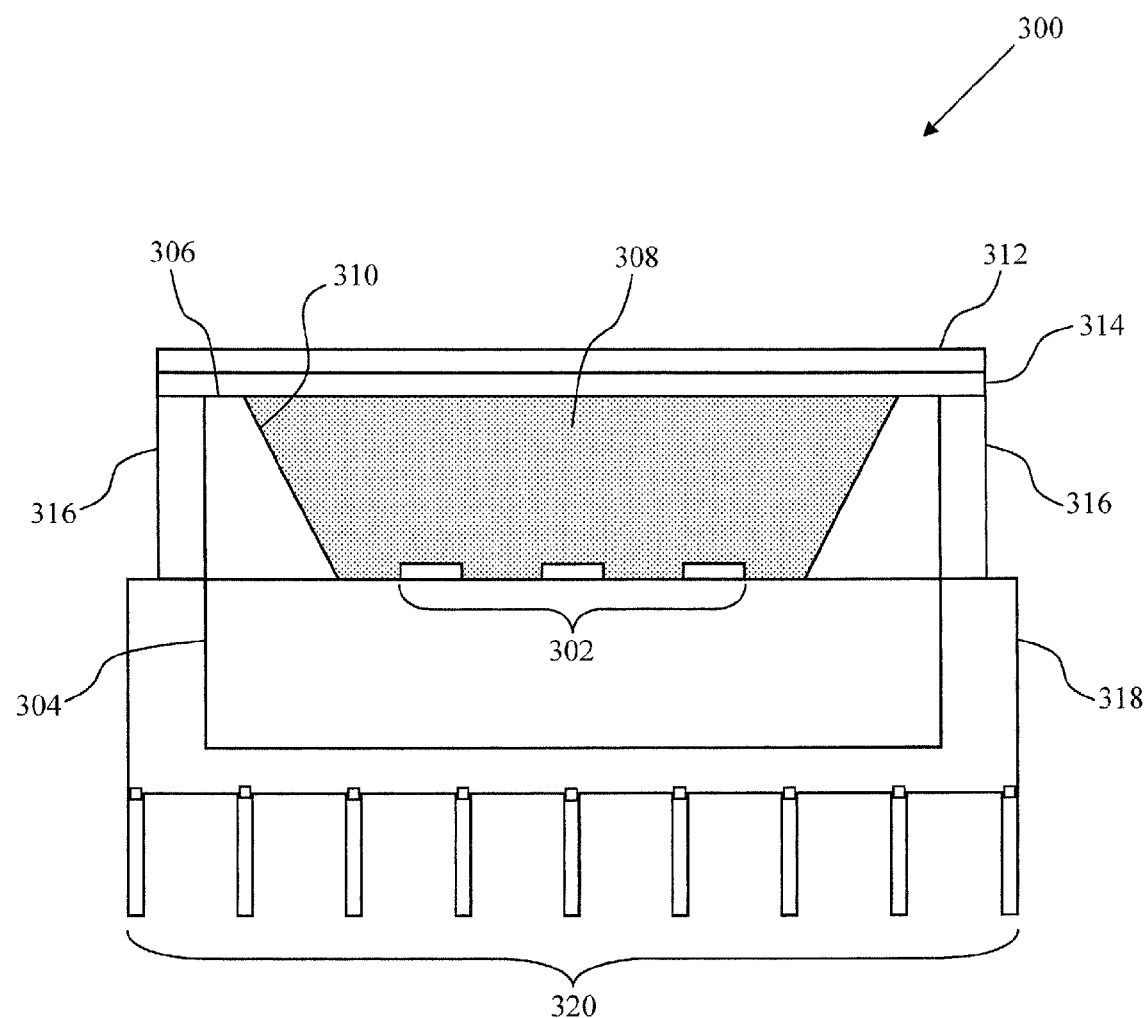
FIG. 3 is a cross-section view illustrating an example of a light emitting device having a plurality of light emitting semiconductors and a transparent thermally conductive layer.

FIG. 3 is a cross-section view illustrating an example of a light emitting device 300 having a plurality of light emitting semiconductors 302 and a transparent thermally conductive layer 314. Each of the plurality of light emitting semiconductors 302, substrate 304, recessed housing 306, cavity 308, reflective inner wall 310, phosphor layer 312, transparent layer 314, metal housing 316, heat-sink 318, and fins 320 of FIG. 3 correspond to the light emitting semiconductors 202, substrate 204, recessed housing 206, cavity 208, reflective inner wall 210, phosphor layer 212, transparent layer 214, metal housing 216, heat-sink 218, and fins 220 of FIG. 2A, respectively, and as such, their respective descriptions are omitted.

The device 300 differs from the device 200 of FIG. 2A in the number of the light emitting semiconductors 302. The device 300 may include any number of the light emitting semiconductors 302 (e.g., nine light emitting semiconductors 302) that may be arranged in an array of any size (e.g., nine of the light emitting semiconductors 302 arranged in a 3.times.3 array).

Figure 4:
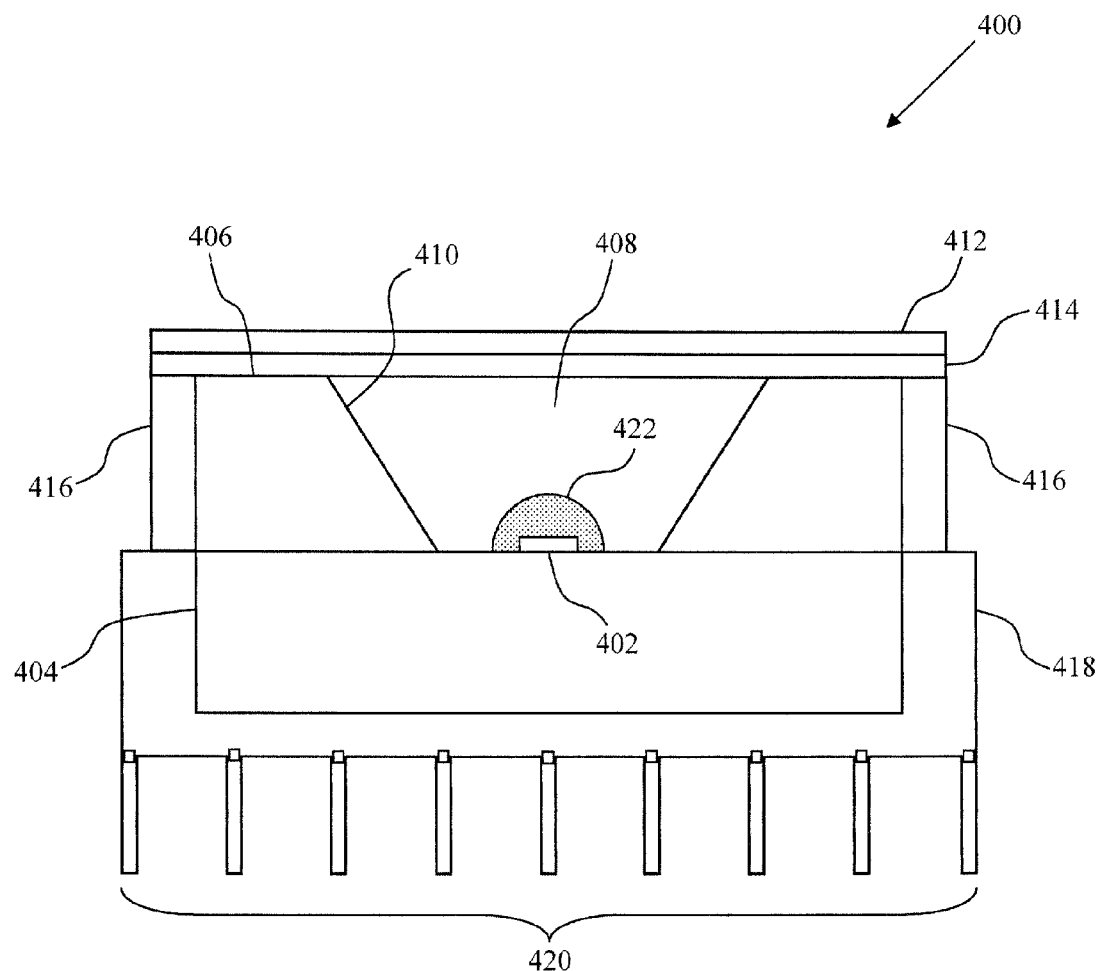
FIG. 4 is a cross-section view illustrating an example of a light emitting device having an encapsulated light emitting semiconductor and a transparent thermally conductive layer.

FIG. 4 is a cross-section view illustrating an example of a light emitting device 400 having a transparent thermally conductive layer 414 and a light emitting semiconductor 402 within an encapsulation layer 422. The light emitting semiconductors 402, substrate 404, recessed housing 406, cavity 408, reflective inner wall 410, phosphor layer 412, transparent layer 414, metal housing 416, heat-sink 418, and fins 420 of FIG. 4 correspond to the light emitting semiconductors 202, substrate 204, recessed housing 206, cavity 208, reflective inner wall 210, phosphor layer 212, transparent layer 214, metal housing 216, heat-sink 218, and fins 220 of FIG. 2A, respectively, and as such, their respective descriptions are omitted.

The device 400 differs from the device 200 of FIG. 2A in that it includes the encapsulation layer 422 that may be deposited so as to encapsulate the light emitting semiconductor 402. The encapsulation layer 422 may be composed of silicone, for example, or a similar material. The encapsulation layer 422 may be of any suitable shape, such as a semispherical dome, for example. The space outside the encapsulation layer 412 within the cavity 408 may be filled with nitrogen, air, or some other suitable gas.

Figure 5:
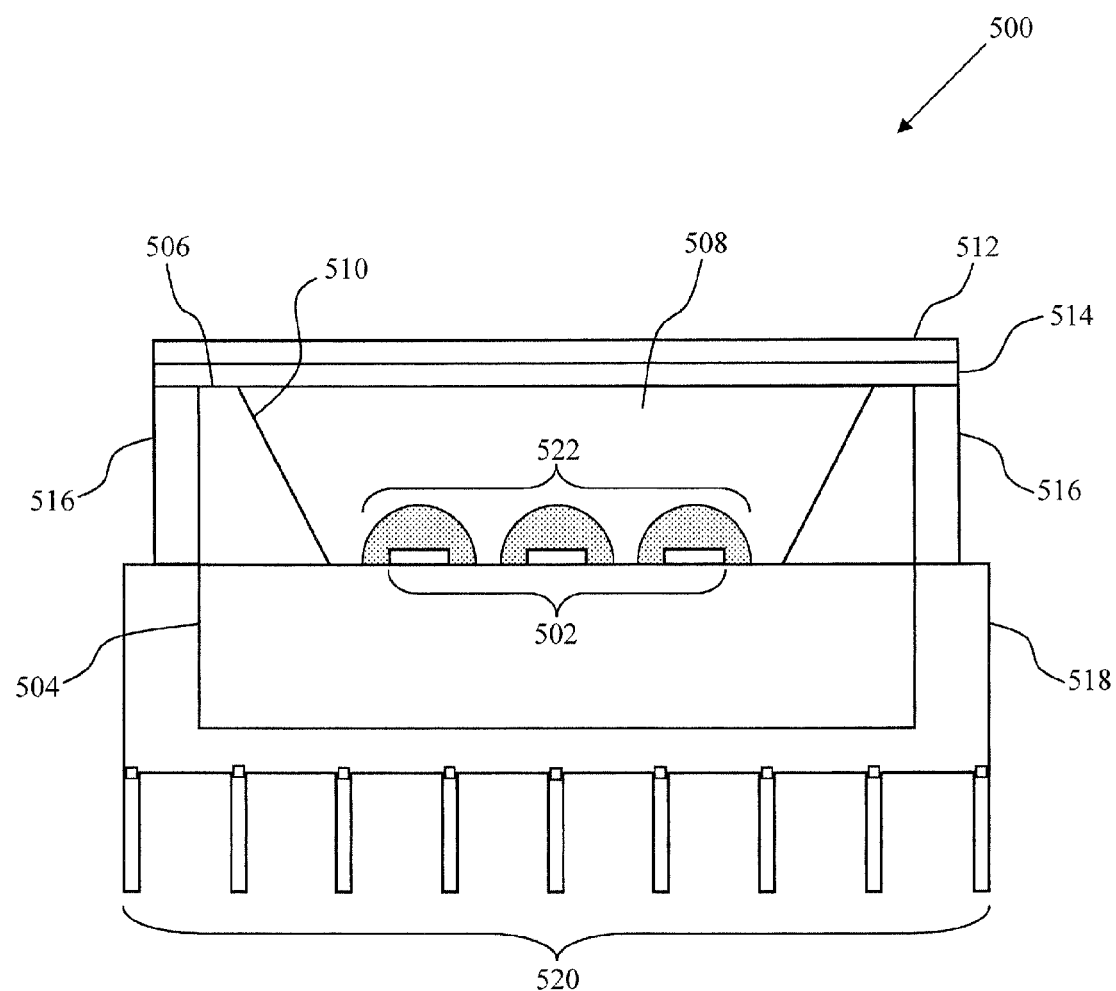
FIG. 5 is a cross-section view illustrating an example of a light emitting device having a plurality of encapsulated light emitting semiconductors and a transparent thermally conductive layer.

FIG. 5 is a cross-section view illustrating an example of a light emitting device 500 having a plurality of encapsulated light emitting semiconductors 502 and a transparent thermally conductive layer 514. Each of the plurality of light emitting semiconductors 502, encapsulation layers 522, substrate 504, recessed housing 506, cavity 508, reflective inner wall 510, phosphor layer 512, transparent layer 514, metal housing 516, heat-sink 518, and fins 520 of FIG. 5 correspond to the light emitting semiconductors 402, encapsulation layer 422, substrate 404, recessed housing 406, cavity 408, reflective inner wall 410, phosphor layer 412, transparent layer 414, metal housing 5416, heat-sink 418, and fins 420 of FIG. 4, respectively, and as such, their respective descriptions are omitted.

The device 500 differs from the device 400 of FIG. 4 in the number of the encapsulated light emitting semiconductors 502. The device 500 may include any number of the light emitting semiconductors 502 that may be arranged in an array of any size, similar to the device 300 shown in FIG. 3.

Figure 6:
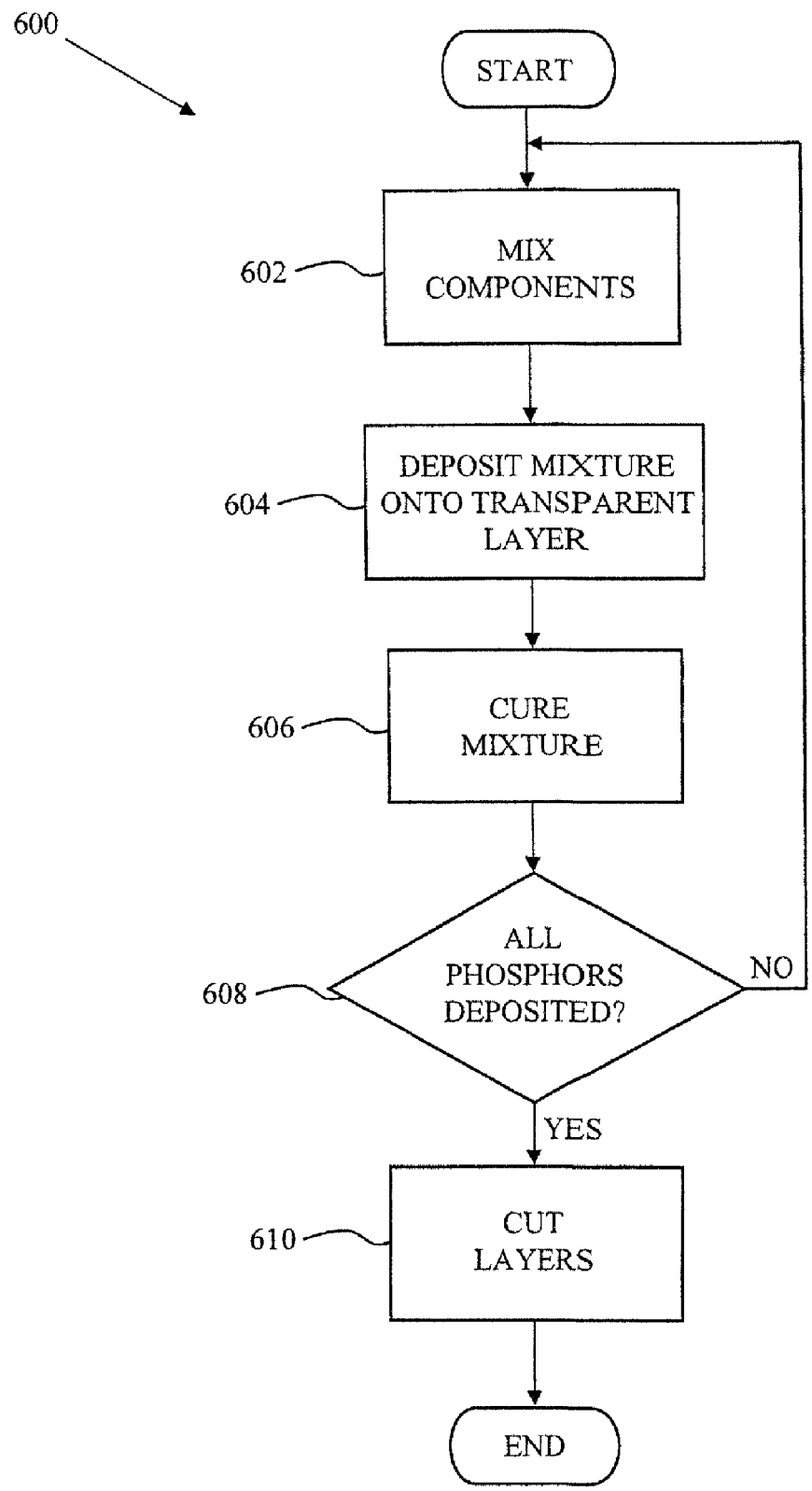
FIG. 6 is a flow-chart diagram illustrating an example of a process for combining a phosphor layer and a transparent thermally conductive layer.

FIG. 6 is a flow-chart diagram 600 illustrating an example of a process for combining a phosphor layer and a transparent layer, such as the phosphor layer 212 and the transparent thermally conductive layer 214 of FIG. 2A. The process begins and proceeds to block 602, where various components of the phosphor layer 212 are mixed. For example, a specific amount of phosphor powder of one particular color or a combination of colors (e.g., yellow, red, green) may be mixed with a specific amount of carrier, such as liquid silicone. The phosphor powder and the carrier may be mixed in a vacuum oven at about 50 degrees Celsius in order to effectively mix and degas the mixture so that the phosphor particles are suspended and evenly dispersed within the carrier and the mixture is substantially devoid of gas bubbles.

Once the mixture is prepared, the process proceeds to block 604, where the mixture is uniformly deposited onto the transparent layer via screen-printing, stenciling, or any other suitable method. A device, such as that used for manufacturing circuit boards, may be used for this purpose. The mixture may be deposited to cover a large portion of the transparent layer area as one continuous layer, a particular pattern, or an array of dots, for example. The thickness of the deposited mixture may be controlled to obtain a desired final thickness of the phosphor layer.

After the mixture is deposited onto the transparent layer, the process proceeds to block 606, where the mixture is cured for a predetermined amount of time (e.g., 30 minutes) at a specific temperature.

After the deposited mixture is cured, the process proceeds to block 608, where a determination is made as to whether all of the desired phosphors (e.g., colors and/or types of phosphor particles) are present on the transparent layer. If it is determined that not all of the desired phosphors are present on the transparent layer, then the process proceeds back to block 602 where a phosphor powder of an additional color and/or type is mixed with the carrier and the process proceeds down through blocks 604-608 until all of the desired phosphors are present on the transparent layer. If, at block 608, it is determined that all of the desired phosphors are present on the transparent layer, then the process proceeds to block 610. At block 610 the cured mixture and transparent layer are cut into predetermined shapes (e.g., circular discs) by a die cutter or a similar device. After block 610, the process ends.

In the case where the process undergoes an iteration for each different phosphor powder, in block 604, each phosphor mixture may be deposited onto the transparent layer as a separate layer in a stacked phosphor layer structure. The stacked phosphor layer structure may include alternating transparent layers and phosphor layers or any kind of stacked arrangement of at least one transparent layer and at least one phosphor layer. Alternatively, each phosphor mixture may be deposited within its respective space on the transparent layer in a predetermined array. The resulting phosphor layer may be a combination of a plurality of stacked layers and arrays of phosphor mixtures. This may be done with a specific lithographic pattern when screen-printing each mixture. The array may be such that each phosphor mixture is deposited so as not to overlap with a neighboring phosphor mixture. It may be desirable to deposit the different color phosphors in such an array to decrease the absorption of light by neighboring phosphor particles of different color. Furthermore, depositing each phosphor mixture separately, whether in a stacked manner or in an array, allows for incompatible phosphor mixtures to exist within the resulting phosphor layer, wherein the incompatible phosphor mixtures are localized within their respective layers and/or areas within the array.

LEDs with a heat dissipation structure including a transparent thermally conductive layer may be used in numerous applications. By way of example, these LEDs may be well suited for liquid crystal display (LCD) backlighting applications. Other applications may include, but are not limited to, automobile interior lighting, light bulbs, lanterns, streetlights, flashlights, or any other application where LEDs are used.

The above description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. An apparatus, comprising:
   a transparent thermally conductive layer;
   a phosphor layer provided on and in direct contact with the transparent thermally conductive layer; and
   at least one light emitting semiconductor arranged to emit light toward the transparent thermally conductive layer and the phosphor layer,
   wherein the transparent thermally conductive layer has a thermal conductivity greater than the thermal conductivity of the phosphor layer and is configured to couple the phosphor layer to a heat sink by direct contact between the transparent thermally conductive layer and a metal housing, and between the metal housing and the heat sink to dissipate heat from the phosphor layer.

2. The apparatus of claim 1, wherein the phosphor layer comprises a plurality of phosphor sections.

3. The apparatus of claim 2, wherein the phosphor sections are an array of phosphor dots.

4. The apparatus of claim 2, wherein the phosphor sections are a plurality of separate phosphor patterns.

5. The apparatus of claim 2, wherein each of the phosphor sections comprises a plurality of phosphor layers stacked one on top of another.

6. The apparatus of claim 5, wherein each of the plurality of phosphor layers are stacked in an alternating manner with each of a plurality of transparent thermally conductive layers.

7. The apparatus of claim 6, wherein each of the plurality of phosphor layers are thermally coupled to a heat sink via at least one of the plurality of transparent thermally conductive layers.

8. The apparatus of claim 2, wherein at least one of the phosphor sections is configured to produce light of a color different from that of at least another one of the phosphor sections.

9. The apparatus of claim 2, wherein at least one of the phosphor sections comprises phosphor particles of a type different from that of at least another one of the phosphor sections.

10. The apparatus of claim 1, further comprising a recessed housing comprising a cavity, wherein the cavity is hermetically sealed.

11. The apparatus of claim 1, wherein the transparent thermally conductive layer is formed of a material selected from a group consisting of glass, sapphire, and diamond.

12. An apparatus, comprising:
    a stack of layers comprising at least one transparent thermally conductive layer and at least one phosphor layer in direct thermal contact with the transparent thermally conductive layer; and
    at least one light emitting semiconductor arranged to emit light toward the stack,
    wherein the at least one transparent thermally conductive layer has a thermal conductivity greater than the thermal conductivity of the phosphor layer and is configured to couple the at least one phosphor layer to a heat sink by direct contact between the transparent thermally conductive layer and a metal housing, and between the metal housing and the heat sink to dissipate heat from the at least one phosphor layer.

13. The apparatus of claim 12, wherein the at least one transparent thermally conductive layer and the at least one phosphor layer are stacked in an alternating manner.

14. A method for manufacturing a light emitting device, comprising:
    depositing at least one phosphor mixture directly onto a transparent thermally conductive layer, the thermally conductive layer having a thermal conductivity greater than the thermal conductivity of the phosphor layer and configured to couple the at least one phosphor mixture to a heat sink by direct contact between the transparent thermally conductive layer and a metal housing, and between the metal housing and the heat sink to dissipate heat from the at least one phosphor mixture.

15. The method of claim 14, wherein one of the phosphor mixtures is deposited in a first array of phosphor sections and another one of the phosphor mixtures is deposited in a second array of phosphor sections such that the phosphor sections of the first array do not overlap the phosphor sections of the second array.

16. The method of claim 14, wherein at least one of the phosphor mixtures is configured to produce light of a color different from that of at least another one of the phosphor mixtures.

17. The method of claim 14, wherein at least one of the phosphor mixtures comprises phosphor particles of a type different from that of at least another one of the phosphor mixtures.

* * * * *